(12) United States Patent
Wang et al.

(10) Patent No.: US 9,329,488 B2
(45) Date of Patent: May 3, 2016

(54) GRID REFINEMENT METHOD

(71) Applicant: Taiwan Semiconductor Manufacturing Company, Ltd., Hsin-Chu (TW)

(72) Inventors: Wen-Chuan Wang, Hsinchu (TW); Shy-Jay Lin, Jhudong Township (TW); Pei-Yi Liu, Changhua (TW); Jaw-Jung Shin, Hsinchu (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/928,810

(22) Filed: Oct. 30, 2015

(65) Prior Publication Data

US 2016/0055291 A1    Feb. 25, 2016

Related U.S. Application Data

(63) Continuation of application No. 14/471,918, filed on Aug. 28, 2014, now Pat. No. 9,176,389, which is a continuation of application No. 13/722,266, filed on Dec. 20, 2012, now Pat. No. 8,822,106.

(60) Provisional application No. 61/623,959, filed on Apr. 13, 2012.

(51) Int. Cl.
*G03F 7/20* (2006.01)
*G06F 17/50* (2006.01)

(52) U.S. Cl.
CPC .............. *G03F 7/70058* (2013.01); *G03F 7/20* (2013.01); *G03F 7/2051* (2013.01); *G03F 7/2059* (2013.01); *G03F 7/70291* (2013.01); *G03F 7/70625* (2013.01); *G06F 17/5081* (2013.01)

(58) Field of Classification Search
CPC ....... G03F 7/20; G03F 7/2051; G03F 7/2059; G03F 7/70058; G03F 7/70291; G03F 7/70625; G06F 17/5081
USPC .............................. 430/22, 30, 296, 394, 942
See application file for complete search history.

(56) References Cited

U.S. PATENT DOCUMENTS

| | | |
|---|---|---|
| 8,510,687 B1 | 8/2013 | Liu et al. |
| 8,530,121 B2 | 9/2013 | Wang et al. |
| 8,584,057 B2 | 11/2013 | Liu et al. |
| 8,822,106 B2 | 9/2014 | Wang et al. |
| 8,822,107 B2 | 9/2014 | Wang et al. |

*Primary Examiner* — Christopher Young
(74) *Attorney, Agent, or Firm* — Haynes and Boone, LLP

(57) ABSTRACT

The present disclosure provides an embodiment of a method, for a lithography process for reducing a critical dimension (CD) by a factor n wherein n<1. The method includes providing a pattern generator having a first pixel size S1 to generate an alternating data grid having a second pixel size S2 that is <S1, wherein the pattern generator includes multiple grid segments configured to offset from each other in a first direction; and scanning the pattern generator in a second direction perpendicular to the first direction during the lithography process such that each subsequent segment of the grid segments is controlled to have a time delay relative to a preceding segment of the grid segments.

20 Claims, 12 Drawing Sheets

$$t = t_0 + (\ell -1)\left(2^{(m-a)} -1\right)\Delta t_0 + y\Delta t$$

$$\ell \in 1 \sim \frac{1}{n^2}, a \geq 0$$

GRID REFINEMENT METHOD

CROSS-REFERENCE TO RELATED APPLICATIONS

This application is a continuation of U.S. Ser. No. 14/471,918, filed Aug. 28, 2014 by inventors Wen-Chuan Wang et al., entitled "GRID REFINEMENT METHOD", which is a continuation of U.S. Ser. No. 13/722,266, filed Dec. 20, 2012, now U.S. Pat. No. 8,822,106, issued Sep. 2, 2014, by inventors Wen-Chuan Wang et al., entitled "GRID REFINEMENT METHOD", which claims the benefit of U.S. Provisional Application No. 61/623,959, filed Apr. 13, 2012 by inventors Wen-Chuan Wang et al., entitled "GRID REFINEMENT METHOD", each of which is herein incorporated by reference in its entirety.

The present disclosure is related to the following commonly-assigned U.S. patent application, the entire disclosure of which is incorporated herein by reference: U.S. Ser. No. 13/368,877 filed Feb. 8, 2012, now issued U.S. Pat. No. 8,530,121, issued Sep. 10, 2013 to inventors Wen-Chuan Wang et al., for "A MULTIPLE-GRID EXPOSURE METHOD".

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, stricter demands have been placed on lithography process. For example, techniques such as immersion lithography, multiple patterning, extreme ultraviolet (EUV) lithography, and e-beam lithography have been utilized to support critical dimension (CD) requirements of the smaller devices. Such lithography methods, however, may result in truncation error which adversely effects the CD required for the smaller deices. Certain compensation methods, such as increasing the number of pixels in an exposure grid and pre-exposure data preparation/computation, have been used to minimize the truncation error. These compensation methods, however, increase manufacturing time and cost. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
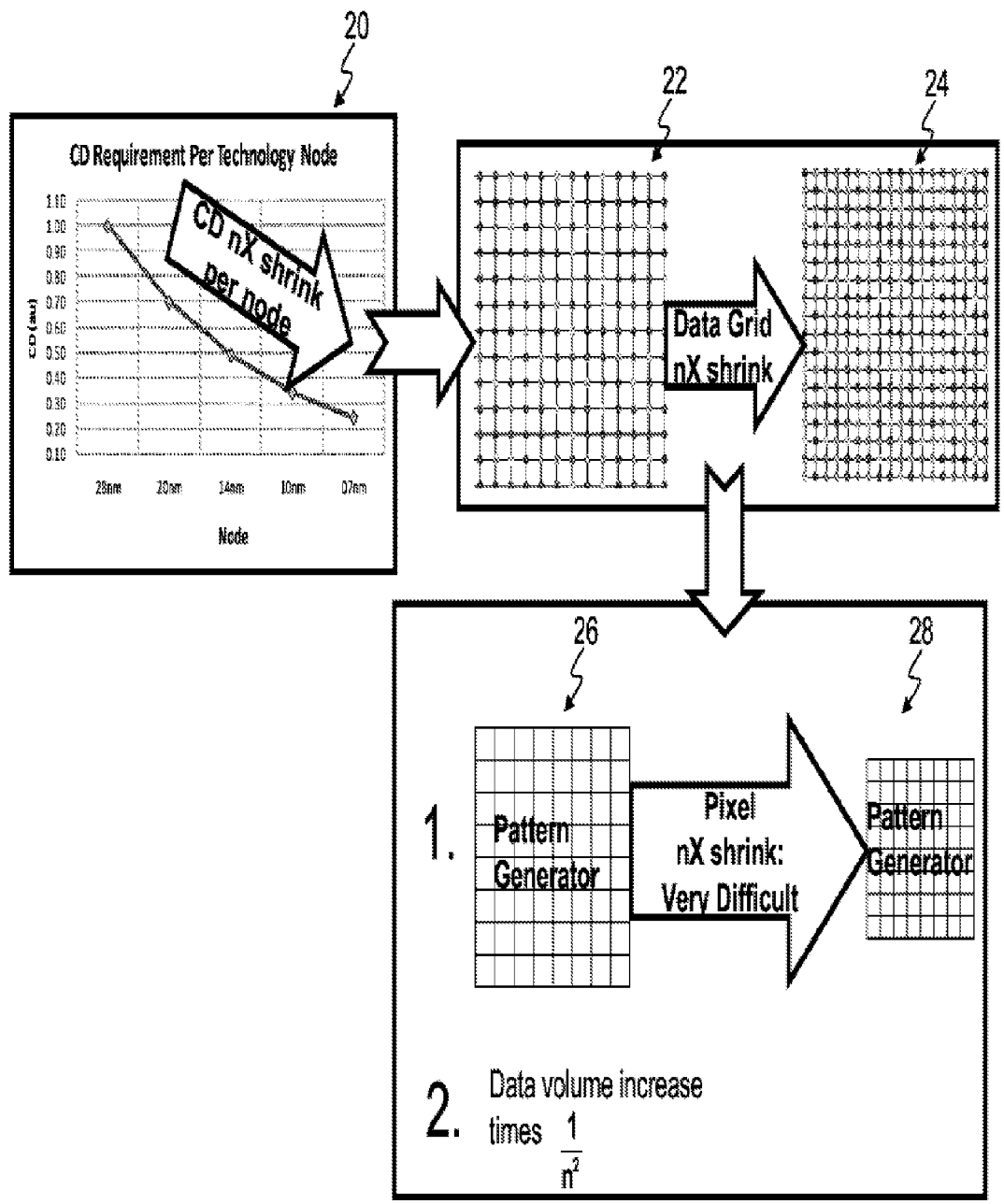
FIGS. 1-6 and 8-9 are schematic views illustrating methods for a lithography process, according to aspects of the present disclosure in various embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

As semiconductor fabrication technologies continue to evolve, lithography processes have been utilized to achieve increasing functional densities and decreasing device sizes. One form of lithography is electron beam (e-beam) lithography. In e-beam lithography, an e-beam apparatus emits beams of electrons in a patterned manner across a surface of a substrate covered with an e-beam sensitive resist film (or resist film). This process may be referred to as an exposure process. A developing process is subsequently utilized to selectively remove either exposed regions or non-exposed regions of the resist film, depending on the resist film being positive or negative. The developing of the resist film results in a patterned resist film, which may be used as a patterned mask to pattern the substrate (or other layers of the substrate) in subsequent fabrication processes.

With reference to FIGS. 1 to 12, a method for lithography process is described below according to various embodiments. FIG. 1 is a schematic view illustrating an exposure method, according to various aspects of the present disclosure in one embodiment. In FIG. 1, the diagram 20 illustrates that critical dimension (CD) shrinks to smaller dimensions when the integrated circuit (IC) fabrications progress to advanced technology nodes. Accordingly, the data grid shrinks to smaller pixel size. The data grid refers to a pattern formed on the resist layer and defined in a grid structure. Exposure dose (or exposure intensity) can be changed per data grid and cannot be independently changed in a fraction of a data grid. In this embodiment, the data grid shrinks accordingly such that small feature can be exposed with a suitable resolution. In one example, the CD shrinks from X to nX where n is less than 1, such as 0.7. Accordingly, the data grid 22 shrinks to a data grid 24 by the same factor n. The pixel area shrinks by a factor $n^2$.

In the present embodiment, an IC pattern (or IC layout design) is transferred to the resist film by a pattern generator.

The pattern generator is a structure capable of generating a lithography exposure pattern during a lithography exposure process by a lithography apparatus, such as an e-beam lithography apparatus. In one example, the pattern generator includes a micro-electric mechanical system (MEMS) with multiple pixels, each being independently operable to be "on" (for an exposure dose) or "off" (no exposure). FIG. 1 illustrates a pattern generator 26 in a top view according to one example. The pattern generator 26 includes a plurality of pixels arranged in an array. Each pixel can be independently and dynamically controlled to switch between two states "on" and "off", representing a signal 1 or 0. For example, when a pixel is in an "on" state, the e-beam can be directed through the pixel. When the pixel is in an "off" state, the e-beam is blocked from going through the pixel. During the lithography process, the e-beam is directed to the pattern generator, the pattern generator is controlled to independently turn on or off each pixel by a control circuit coupled with each pixel and addressing each pixel.

Furthermore, when the CD shrinks from X to nX, the pattern generator 26 shrinks to a pattern generator 28 by a same factor n. In other words, the pattern generator 26 has a pixel dimension X and the pattern generator 28 has a pixel dimension nX.

In this embodiment, there are various challenges. First, shrinking the pixel size of the pattern generator is very difficulty or may not be achievable considering each pixel having its own control circuit (pixel control circuit) coupled with the pixel and configured in the corresponding area of the pixel. Particularly, the pixel control circuit is disposed approximate to an active portion of the pixel (such as a moving element of the pixel) and occupies a certain surface area of the pixel, the shrinking by scaling has its limit due to the surface area confliction.

Second, by shrinking the pixel size, the number of pixels in a unit area of the pattern generator is increased by a factor $1/n^2$. The data used to control the pattern generator are increased by the same factor. As shown in FIG. 1, the data volume is increased by the factor of $1/n^2$ that is greater than 1. For example, if n is 0.7, the data volume is about doubled.

Figure 2:
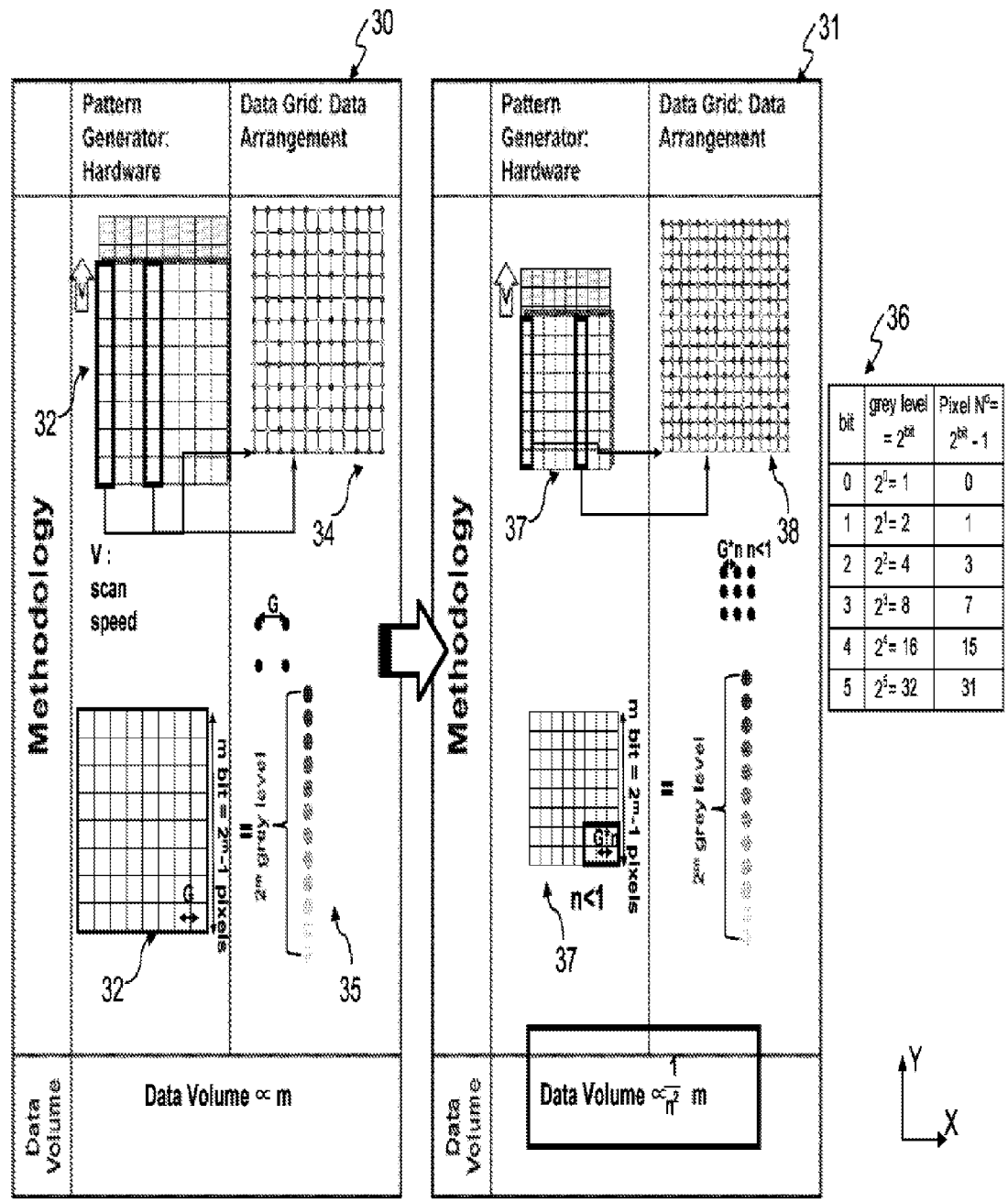

The method of the FIG. 1 is further described with reference to FIG. 2 as a schematic view, according to various aspects of the present disclosure in one embodiment. Particularly, the pattern generator and the data grid before the shrinking are illustrated in the left table 30 and the pattern generator and the data grid after the shrinking are illustrated in the right table 31. In the left table 30 prior to the shrinking, the pattern generator 32 includes a plurality of pixels in an array. In this example, the pattern generator 32 has the pixels arranged in an orthogonal matrix. The X axis and Y axis are illustrated in FIG. 2 as a reference. The pixels of the pattern generator 32 arranges into multiple rows. Each row spans in the X direction and includes Nx pixels. Similarly, the pixels of the pattern generator 32 arranges into multiple columns. Each column spans in the Y direction and includes Ny pixels. Total number of the pixels in the pattern generator is Nx*Ny. Each pixel has a same dimension G.

During a lithography process, the pattern generator 32 is thus configured and scans over the resist film along the Y direction with a speed V relative to the resist film. The corresponding data grid 34 is illustrated. The pixels in the data grid 34 has a pixel dimension G same to the pixel dimension of the pattern generator 32. When a field is thus exposed, the pattern generator 32 is stepped to another field, and the similar scan is repeated to the next field. The resist film coated on the substrate is thus exposed with one or more IC patterns are imaged to the resist film. Each field in the data grid is a strip with width defined in the X direction and covers Nx pixels. Each pixel in the data grid 34 is scanned by Ny pixels in the corresponding column of the pattern generator 32. Thus, the exposure dose (electron intensity) in that pixel is the collective result of the Ny pixels in the corresponding column, or the sum of exposure doses of the Ny pixels in the column of the pattern generator. As noted above, each pixel can be independently turned on or off, therefore has two exposure doses, respectively represented by full dose (or maximum dose) and none (or minimum dose). With different combinations of the Ny pixels in various states (on and off), Ny+1 gray levels are achieved in term of the exposure dose. If the pixel intensity of each pixel in the pattern generator is represented by 1 for "on" state and "0" for "off" state in a proper unit, the lowest intensity in one pixel of the data grid 34 achieved by the pattern generator is 0 and the highest intensity is Ny. All other gray levels 1, 2, . . . , and Ny−1 can be provided by various combinations and thus the total Ny+1 gray levels are achieved.

When m bits of data are provided to address gray levels, the total gray levels are $2^m$ as illustrated by gray levels 35 in FIG. 2. The number of pixels Ny in each column of the pattern generator 32 needs to be $2^m-1$ to provide $2^m$ gray levels. The bit, gray level and number of pixels (in each column of the pattern generator 32) are further illustrated in a table 36. The data volume is proportional to the parameter m, as indicated in the "data volume" of the table 30.

When the pattern generator 32 is scanned over one field of the substrate along the Y direction, the exposed field has a distributed intensity and is represented by the data grid 34. For example, the pixels in the left column of the pattern generator 32 sequentially scan through a pixel in the left column of the data grid 34. Similarly, the pixels in the fourth column of the pattern generator 32 sequentially scan through a pixel in the fourth column of the data grid 34.

In this method, when the CD is scaled down by n, the pattern generator 32 is replaced by another pattern generator 37 with a pixel dimension correspondingly reduced to n*G. Corresponding data grid 38 shrinks as well and has a reduced pixel dimension n*G. Accordingly, the data volume is increased by a factor $1/n^2$ since the number of pixels per unit area of the pattern generator 37 is increased by the factor $1/n^2$. The data volume associated with the pattern generator 37 is proportional to $m/n^2$ as indicated in the "data volume" of the table 31.

Figure 3:
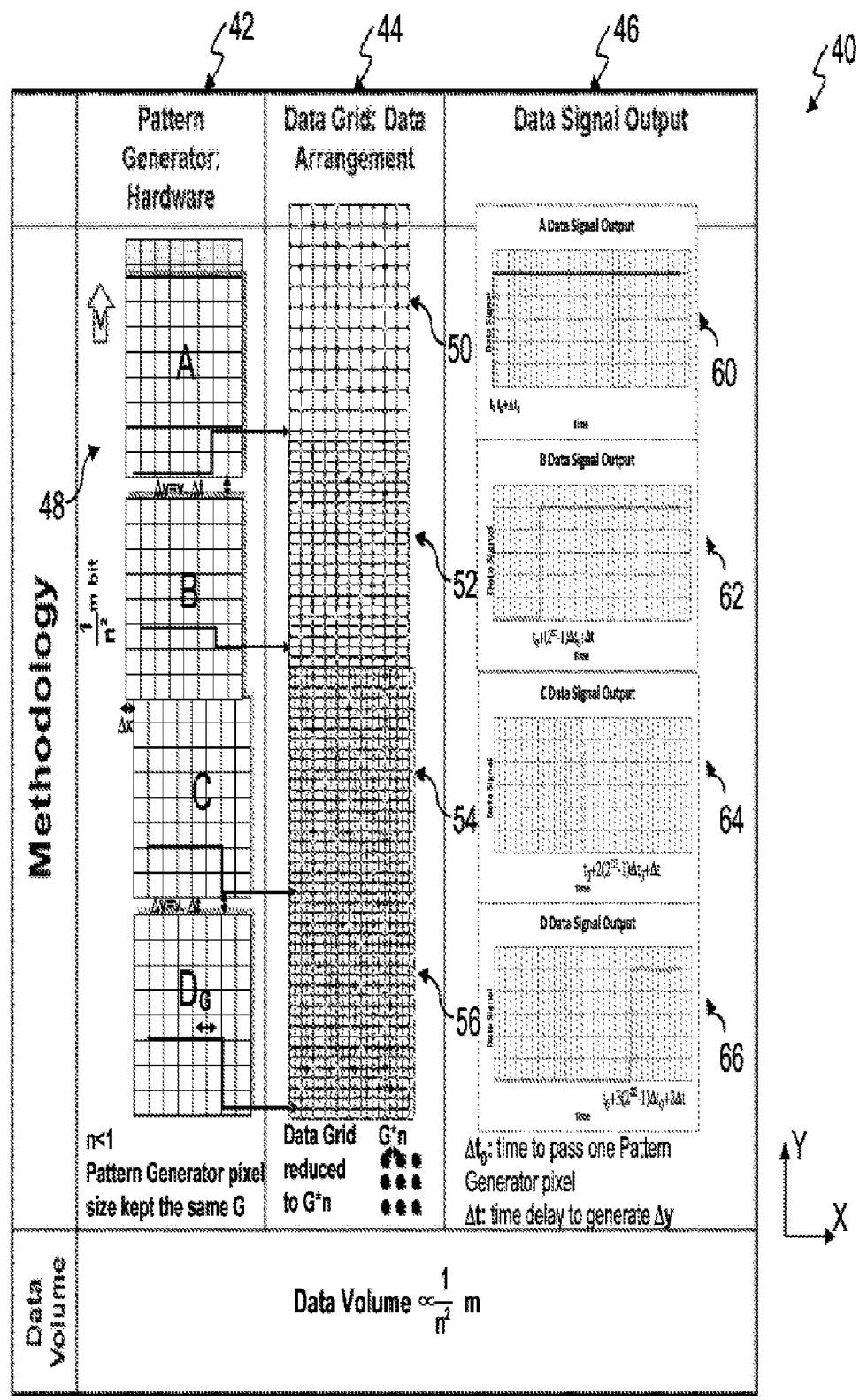

FIG. 3 is a schematic view of a method 40 for a lithography process with reduced data grid for small CDs but without reducing the pixel dimensions of the pattern generator. The method 40 and the corresponding pattern generator are collectively described with reference to FIG. 3 that includes a block 42 for pattern generator, a block 44 for data grid and a block 46 for data signal output. It is still assumed that the CD scales down by a factor n that is less than 1. As one example, the parameter n is 0.5. It is understood that the parameter n can be any proper value less than 1. Pattern generator 48 is designed to include a plurality of grid segments (or segments) configured along the scan direction that is Y direction. The pixels of the pattern generator 48 still remain the same pixel dimension G. In one example, the pixels have a square geometry, the dimensions of the pixels in both X and Y directions are G. In another embodiment, the pixels have a rectangular geometry, and the dimension of the pixels in X direction is G. In the present example for illustration, the pattern generator 48 includes 4 segments labeled as A, B, C and D, respectively. Each segment is shifted by a fraction of the pixel dimension G along the direction perpendicular to the scan direction or is controlled to have delayed data signal output.

The data signal output is the signal sent to the pattern generator 48 and controls the respective pixel to response to the pattern data for "on" and "off". The data signal output is not pattern data itself but a clock signal to control the timing of the pixels. The method 40 includes how the data signal output is timed to achieve a shift between the segments along the scan direction and forms a data grid with a reduced pixel size.

Each segment includes a plurality of pixels in an array, such as an array with multiple rows each spanned in X direction and multiple columns each spanned in Y direction. Furthermore, each row includes Nx pixels and each column includes Ny pixels. To achieve $2^m$ gray levels, the number of pixels in each column is $2^m-1$ or Ny=$2^m-1$.

It is further described how the pattern generator 48 is designed and how a data grid with reduced pixel size is formed without reducing the pixel size of the pattern generator. Particularly, the pixel size of the data grid is reduced to n*G but the pixel size of the pattern generator 48 remains as G.

As mentioned earlier, the first segment A of the pattern generator 48 scans with speed V in the Y direction through a field and forms an exposure pattern in the field and the exposure pattern is defined in a first data grid 50 (or data grid A). The data grid 50 has the same pixel size G. The data signal output 60 for the first segment is illustrated in the graph the "data signal output" block 46, where $\Delta t_0$ is the time to pass one pattern generator pixel during the scan, and $t_0$ represents time zero for scanning the respective field.

In the present example of the pattern generator 48, the second segment B is similar to the first segment A but is controlled to have a time delay $\Delta t$ during the lithography process. Note the pattern generator scans in the Y direction with a speed V and the travel time to pass one pattern generator pixel is $\Delta t_0$. The travel time to pass one segment of the pattern generator 48 is Ny*$\Delta t_0$ or $(2^m-1)*\Delta t_0$. The data signal output to the second segment is supposed to be $(2^m-1)*\Delta t_0$ later than the data signal output to the first segment if without time delay. Thus the exposure doses from the first segment and second segment are synchronized to the same pixels in the corresponding data grid. Delaying the data output signal of the second segment B by $\Delta t$, the data output signal 62 is actually $(2^m-1)*\Delta t_0+\Delta t$ later than the data signal output 60 to the first segment. Delaying the data output signal of the second segment B by $\Delta t$, the exposure dose by the second segment offsets from the exposure dose of the first segment by a distance $\Delta y=V*\Delta t$ in Y direction. In other words, the exposure dose generated by the second segment is defined by another data grid (data grid B) similar to the first data grid 50 but has an offset $\Delta y=V*\Delta t$ in Y direction. In the present case, the $\Delta y$ is chosen to be G/2 or generally nG. Accordingly, the time delay is chosen to be n*(G/V) or n*$\Delta t_0$. The exposure dose defined in the second data grid B and the exposure dose defined in the first data grid A define a collective exposure dose from the segment A and segment B. The collective exposure dose is defined by a collective data grid 52 with reduced pixel dimension in Y direction. The data signal output 62 for the second segment B is $t_0+(2^m-1)*\Delta t_0+\Delta t$ as indicated in "data signal output" block 46.

The third segment C of the pattern generator 48 is similar to the second segment B but is configured to have an offset to the second segment by $\Delta x$ in X direction. $\Delta x$ is a fraction of G, such as G/2 in the present example where 1/n=2. The exposure dose from the third segment C is defined in a data grid C and is similar to the exposure dose from the second segment defined in the data grid B but has a shift $\Delta x$ in X direction. A collective exposure dose from the first, second and third segments are summation of the first exposure dose from the first segment, the second exposure from the second segment and the third exposure dose from the third segment. The collective exposure dose is defined by the third data grid 54 with reduced pixel dimension in Y direction and reduced pixel dimension in X direction. The data output signal 64 for the third segment C is $t_0+2(2^m-1)*\Delta t_0+\Delta t$ as indicated in the "data signal output" block 46.

The fourth segment D of the pattern generator 48 is similar to the third segment C but is controlled to have a time delay $\Delta t$ during the lithography process relative to the third segment. The exposure dose from the fourth segment D is defined in a data grid D and is similar to the exposure dose from the third segment defined in the data grid C but has a shift $\Delta y=V*\Delta t$ in Y direction. A collective exposure dose from the first, second, third and fourth segments are summation of the first exposure dose from the first segment, the second exposure from the second segment, the third exposure dose from the third segment and the fourth exposure dose from the fourth segment. The collective exposure dose is defined by the fourth data grid 56 with further reduced pixel dimension in Y direction and reduced pixel dimension in X direction. The data output signal 66 for the fourth segment D is $t_0+3(2^m-1)*\Delta t_0+2\Delta t$ as indicated in the "data signal output" block 46.

Overall, the collective exposure dose from various segments of the pattern generator 48 defines the collective data grid 56 with reduced pixel dimensions. Particularly, by choosing proper $\Delta x$ and $\Delta t$, the pixel dimensions (in X and Y directions) are reduced to G*n. The pixel area of the collective data grid 56 is reduced by a factor $n^2$. The data volume is proportional to $m/n^2$. Thus, by implementing the method 40 and the pattern generator 48, the data grid is reduced without reducing the pixel size of the pattern generator 48. The data volume is increased by a factor $m/n^2$. It is understood that the pattern generator 48 is only an example. The pattern generator 48 may include a different number of segments each being shifted by $\Delta x$ and delayed by $\Delta t$ to the proceeding segment. When the scaling factor n is a different value, the number of segments is changed accordingly. For example, when n is ⅓, the number of segments is increased to 9. Generally speaking, the number of segments is determined by the factor $1/n^2$.

Figure 4:
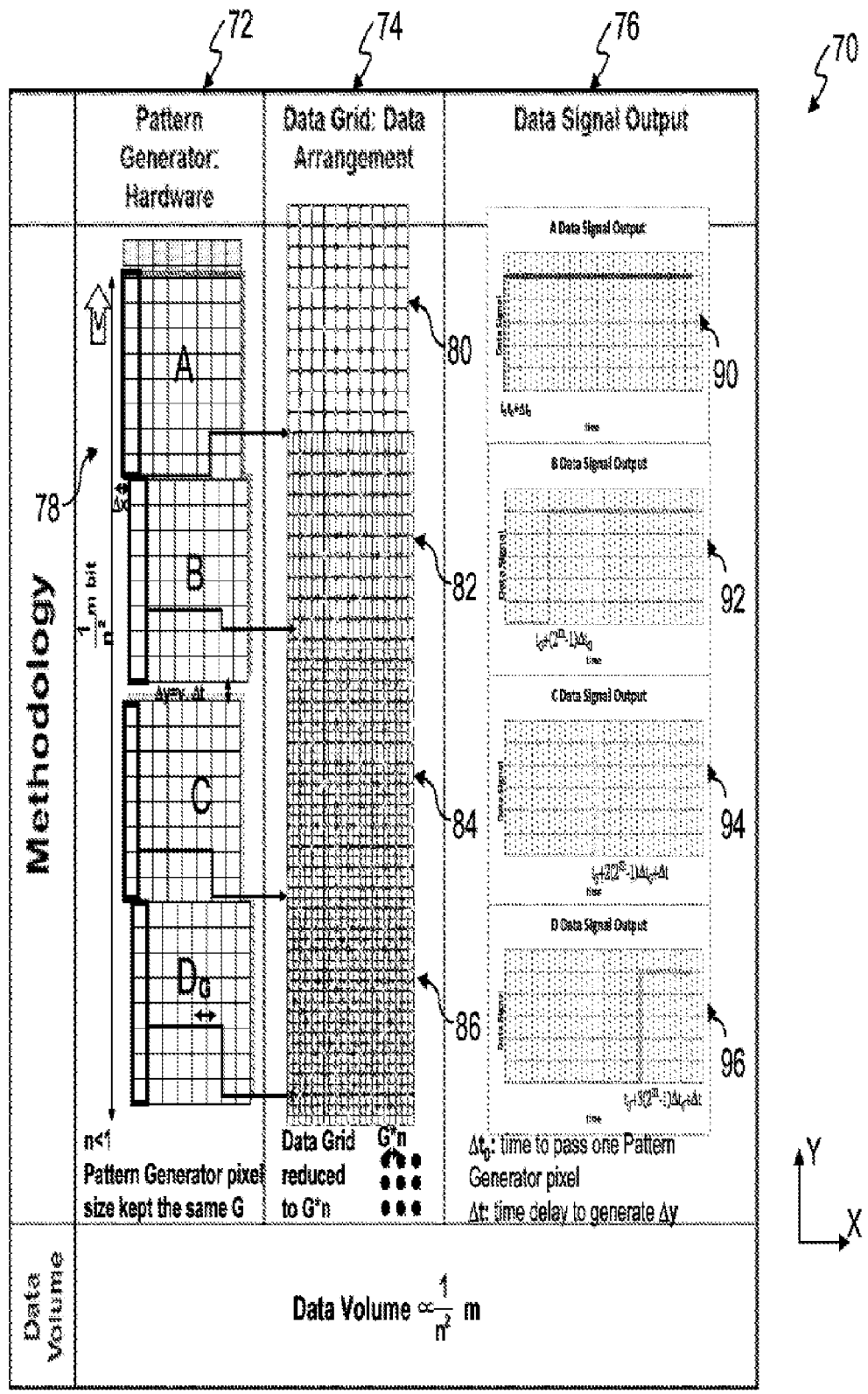

FIG. 4 is a schematic view of a method 70 for a lithography process with reduced data grid for small CDs but without reducing the pixel dimensions of the pattern generator. The structure of the pattern generator and the method 70 are collectively described with reference to FIG. 4 that includes a block 72 for pattern generator, a block 74 for data grid and a block 76 for data signal output. It is still assumed that the CD scales down by a factor n that is less than 1. In one example, the scaling factor n is 0.5.

In the method 70, a pattern generator 78 is used and includes a plurality of segments configured with relative offset or controlled with relative time delay similar to the pattern generator 48. Particularly, pattern generator 78 is designed to include a plurality of segments configured along the scan direction that is Y direction. The pixels of the pattern generator 78 still remain the same pixel dimension G. In one example, the pixels have a square geometry and the dimensions of the pixels in both X and Y directions are G. In another embodiment, the pixels have a rectangular geometry and the dimension of the pixels in X direction is G. In the present example for illustration, the pattern generator 78 includes 4 segments labeled as A, B, C and D, respectively. Each segment is shifted by a fraction of the pixel dimension G along the direction perpendicular to the scan direction or is controlled to have delayed data signal output relative to the preceding segment.

Each segment includes a plurality of pixels in an array, such as an array with multiple rows each spanned in X direction and multiple columns each spanned in Y direction. Furthermore, each row includes Nx pixels and each column includes Ny pixels. To achieve $2^m$ gray levels, the number of pixels in each column is $2^m-1$ or $Ny=2^m-1$.

The similar features and actions are not described for simplicity. However, the pattern generator 78 is different from the pattern generator 48 since the four segments are configured differently. Specifically, the segment B is configured to have an offset from the segment A by a distance $\Delta x$ in the X direction. The segment C is aligned with the segment A in the X direction and controlled to have a time delay $\Delta t$ during the lithography process, causing exposure dose shifted in the Y direction by $\Delta y=V*\Delta t$. The segment D is configured to have an offset from the segment C by a distance $\Delta x$ in the X direction.

The method 70 is different from the method 40 since the method 70 uses the pattern generator 78 different from the pattern generator 48 and provides different data signal output for proper time delay during the lithography process. Particularly, the data signal output 90 for the segment A is $t_0$. The data signal output 92 for the segment B is $t_0+(2^m-1)*\Delta t_0$. The data signal output 94 for the segment C is $t_0+2(2^m-1)*\Delta t_0+\Delta t$. The data signal output 96 for the segment D is $t_0+3(2^m-1)*\Delta t_0+\Delta t$.

The segment A during the lithography process forms a data grid A (labeled as 80) as illustrated in FIG. 4. The pixel dimensions of the data grid A are same to the pixel dimension G of the pattern generator 78. The segment B during the lithography process forms data grid B similar to the data grid A from the segment A but is shifted by $\Delta x$ in X direction. The collective exposure dose from both segments A and B is defined in a data grid 82 having a reduced pixel dimension in the X direction.

The segment C during the lithography process forms data grid C similar to the data grid A from the segment A but is shifted by $\Delta y=V*\Delta t$ in Y direction achieved by the time delay $\Delta t$. The collective exposure dose from the segments A, B and C is defined in a data grid 84 having a reduced pixel dimension in the X direction and a reduced pixel dimension in the Y direction.

The segment D during the lithography process forms data grid D similar to the data grid C from the segment C but is shifted by $\Delta x$ in X direction. The collective exposure dose from all segments A, B, C and D is defined in a data grid 86 having a reduced pixel dimension in the X direction and a reduced pixel dimension in the Y direction.

Overall, the collective exposure dose from various segments of the pattern generator 78 defines the collective data grid 86 with reduced pixel dimensions. Particularly, by choosing proper $\Delta x$ (and $\Delta t$), the pixel dimension in X direction (and in Y direction) is reduced to $G*n$. The pixel area of the collective data grid 86 is reduced by a factor $n^2$. The data volume is proportional to $m/n^2$. Thus, by implementing the method 70 and the pattern generator 78, the data grid is reduced without reducing the pixel size of the pattern generator 78. The data volume is increased by a factor $m/n^2$. It is understood that the pattern generator 78 is only an example. When the scaling factor n has a different value, the pattern generator 78 may include a different number of segments each being shifted by $\Delta x$ or delayed by $\Delta t$ to the proceeding segment.

Figure 5:
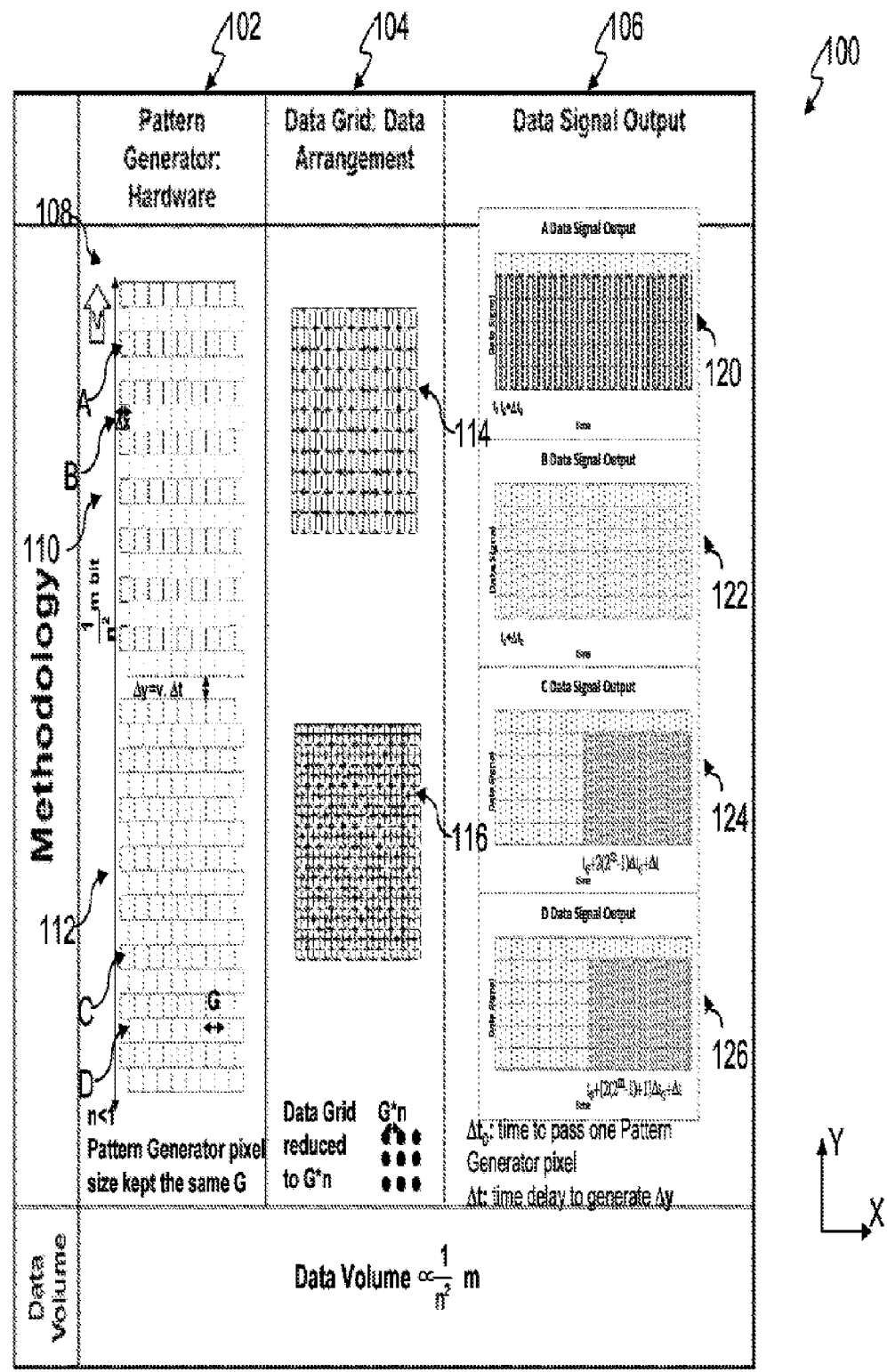

FIG. 5 is a schematic view of a method 100 for a lithography process with reduced data grid for small CDs but without reducing the pixel dimensions of the pattern generator. The method 100 and the corresponding pattern generator are collectively described with reference to FIG. 5 that includes a block 102 for pattern generator, a block 104 for data grid and a block 106 for data signal output. It is still assumed that the CD scales down by a factor n that is less than 1. In one example, the scaling factor n is 0.5.

In the method 100, a pattern generator 108 is used and includes a plurality of segments controlled with relative time delay. Particularly, the pattern generator 108 is designed to include a plurality of segments configured along the scan direction that is Y direction. The pixels of the pattern generator 108 still remain the same pixel dimension G. In one example, the pixels have a square geometry and the dimensions of the pixels in both X and Y directions are G. In another embodiment, the pixels have a rectangular geometry, and the dimension of the pixels in X direction is G. Each segment includes a plurality of pixel rows with alternative shift on the X direction and a set of the segments are controlled to have time delay.

In the present example for illustration, the pattern generator 108 includes 2 segments referred to as 110 and 112, respectively. The pattern generator 108 is further described below according to the present example. The first segment 110 includes two sets of pixel rows oriented in the X direction and disposed alternatively in the Y direction. A first set of pixel rows is referred to as A and a second set of pixel rows is referred to as B. The first set of pixel rows A includes $Ny=2^m-1$ rows and the second set of pixel rows B includes $Ny=2^m-1$ rows as well. Each row includes Nx pixels. The second set of pixel rows B are further configured to have an offset to the first set of pixel rows A by $\Delta x$ in the X direction.

The second segment 112 is similar to the first segment 110. The second segment 112 includes two sets of pixel rows oriented in the X direction and disposed alternatively in the Y direction. In the second segment 112, a first set of pixel rows is referred to as C and a second set of pixel rows is referred to as D. The first set of pixel rows C includes $Ny=2^m-1$ rows and the first set of pixel rows D includes $Ny=2^m-1$ rows as well. Each row includes Nx pixels. The second set of pixel rows D are further configured to have an offset to the first set of pixel rows C by $\Delta x$ in the X direction.

According to the present embodiment in a broader form when the scaling factor n is any proper value, such as $1/n$ being 2 or 3, a number of the grid segments in the pattern generator equals to $1/n$. Each of the grid segments includes a grid array with $(2^m-1)/n$ pixels in each column along the second direction and the data grid has $2^m$ gray levels. The $(2^m-1)/n$ pixels in the column are grouped into $(2^m-1)$ groups and each group includes $1/n$ pixels configured to offset from each other in the first direction.

Furthermore, the second segment 112 is controlled to have a time delay $\Delta t$ during a lithography process, causing exposure dose shifted in the Y direction by $\Delta y=V*\Delta t$.

The method 100 is different from the method 40 (or the method 70) since the method 100 uses the pattern generator 108 different from the pattern generator 48 (or the pattern generator 78) and provides different data signal output for proper time delay during the lithography process. The data signal output 120 for the first set of pixel rows A in the first segment 110 is indicated in the respective graph. The data signal output 122 for the second set of pixel rows B in the first segment 110 is indicated in the respective graph. Especially, since the first set of rows A and the second set of rows B are alternatively disposed in the same grid segment, The data output signals for the first set (rows A) and the second set (rows B) are alternatively on and off for scanning the respective portions such that the pattern generator is able to receive proper signals for the A rows and B rows. Thus, the data output signal 120 for the rows A and the data output signal 122 for the rows B together constitute a collective data output signal for the first segment 110 (including both rows A and rows B) in a same sequence. More particularly, the data output signal 120 is on for a period of time to scan a distance G for its respective pixel while the data output signal 122 is off. The data output signal 120 is off while the data output signal 122 is on for the same period of time to scan another distance for its respective pixel. In the present embodiment, the period of time is $G/V=\Delta t_0$. Sequentially, the data output signal 120 is on, off, on, off, . . . while the data output signal 122 is off, on, off, on, . . . .

The start time for the second set of pixel rows B in the first segment 110 is different from the start time for the first set of pixel rows A in the first segment 110 as indicated in the data signal outputs 120 and 122. Particularly, the start time for the first set of pixel rows A in the first segment 110 is $t_0$, and the start time for the second set of pixel rows B in the first segment 110 is $t_0+\Delta t_0$.

The data signal output 124 for the first set of pixel rows C in the second segment 112 is $t_0+2(2^m-1)*\Delta t_0+\Delta t$. The data signal output 126 for the second set of pixel rows D in the second segment 112 is $t_0+[2(2^m-1)+1]*\Delta t_0+\Delta t$. Particularly, the start time for the third set of pixel rows C in the second segment 112 is different from the start time for the second set of pixel rows D in the second segment 112 as indicated in the signals 124 and 126.

The first set of pixel rows A in the first segment 110 during the lithography process forms a data grid A with a same pixel dimension as the pixel dimension G of the pattern generator 108. The second set of pixel rows B in the first segment 110 during the lithography process forms a data grid B with a same pixel dimension G. However, the data grid B is only shifted from the data grid A in the X direction. A collective exposure dose from both the first set A and the second set B is defined by a data grid 114 having a reduced pixel dimension in the X direction.

Similarly, the first set of pixel rows C in the second segment 112 during the lithography process forms a data grid C with a same pixel dimension as the pixel dimension G of the pattern generator 108. The second set of pixel rows D in the second segment 112 during the lithography process forms a data grid D with a same pixel dimension G. Furthermore, the data grid D is only shifted from the data grid C in the X direction. A collective exposure dose from both the first set C and the second set D is defined by a data grid having a reduced pixel dimension in the X direction.

However, the data grid from the second segment 112 is different from the data grid from first segment 110 since there is offset $\Delta y=V*\Delta t$ in the Y direction introduced by the time delay $\Delta t$. Furthermore, a collective exposure dose from both first segment 110 and second segment 112 is defined by a data grid 116 having a reduced pixel dimension in the X direction and a reduced pixel dimension in the Y direction.

By implementing the pattern generator 108 and the method 100, without reducing the pixel size of the pattern generator, the data grid 116 generated thereby has a reduced pixel size as n*G where G is the pixel size of the pattern generator 108 and n is the scaling factor. The number of gray levels in each pixel of the data grid 116 is $Ny=2^m-1$. The data volume is increased by a factor $m/n^2$. It is understood that the pattern generator 108 is only an example. When the scaling factor n has a different value, the pattern generator 108 may include a different number of segments. Each segment has an alternating structure with adjacent rows shifted by $\Delta x$ in the X direction and a set of the segments are controlled to have time delay $\Delta t$.

Figure 6:
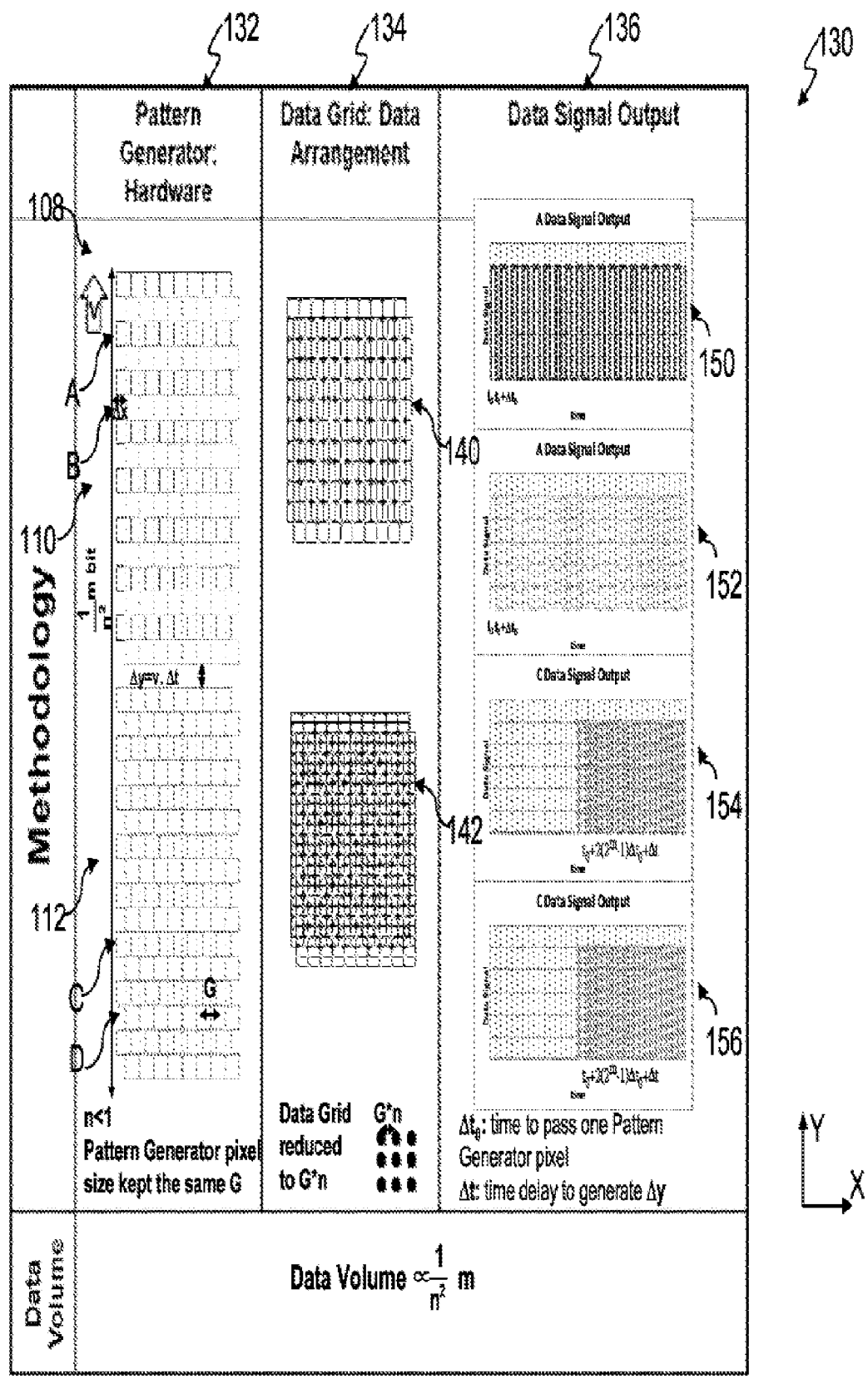

FIG. 6 is a schematic view of a method 130 for a lithography process with reduced data grid for small CDs but without reducing the pixel dimensions of the pattern generator. The method 130 and the corresponding pattern generator are collectively described with reference to FIG. 6 that includes a block 132 for pattern generator, a block 134 for data grid and a block 136 for data signal output. It is still assumed that the CD scales down by a factor n that is less than 1. In one example, the scaling factor n is 0.5.

In the method 130, a pattern generator 108 is used and includes a plurality of segments controlled with relative time delay. The pattern generator 108 is similar to the pattern generator 108 of FIG. 5 in term of configuration but is controlled with different data signal output. The detailed description of the pattern generator 108 is not repeated here for simplicity.

The method 130 is different from the method 100 since the method 130 provides different data signal output for time delay during the lithography process. Particularly, the data signal output 150 for the first set of pixel rows A in the first segment 110 is indicated in the respective graph. The data signal output 152 for the second set of pixel rows B in the first segment 110 is indicated in the respective graph. The start time for the second set of pixel rows B in the first segment 110 is the start time for the first set of pixel rows A in the first segment 110 as indicated in the signals 150 and 152. In the present embodiment, the both start at $t_0$.

Similarly, since the first set of rows A and the second set of rows B are alternatively disposed in the same grid segment, the data output signals for the first set (rows A) and the second set (rows B) are alternatively on and off such that the pattern generator is able to receive proper signals for the A rows and B rows. Thus, the data output signal 150 for the rows A and the data output signal 152 for the rows B together constitute a collective data output signal for the first segment 110 (including both rows A and rows B) in a same sequence. More particularly, the data output signal 150 is on while the data output signal 152 is off. The data output signal 150 is off while the data output signal 152 is on. Sequentially, the data output signal 150 is on, off, on, off, . . . while the data output signal 152 is off, on, off, on, . . . .

The data signal output 154 for the first set of pixel rows C in the second segment 112 is $t_0+2(2^m-1)*\Delta t_0+\Delta t$. The data signal output 156 for the second set of pixel rows D in the second segment 112 is $t_0+2(2^m-1)*\Delta t_0+\Delta t$ (same as pixel rows C). Particularly, the start time for the third set of pixel rows C in the second segment 112 is the same start time for the second set of pixel rows D in the second segment 112 as indicated in the signals 154 and 156.

Accordingly, the first set of pixel rows A in the first segment 110 during the lithography process forms a data grid A with a same pixel dimension as the pixel dimension G of the pattern generator 108. The second set of pixel rows B in the first segment 110 during the lithography process forms a data grid B with the same pixel dimension G. However, the data grid B is not only shifted from the data grid A in the X direction but also in the Y direction. A collective exposure dose from both the first set A and the second set B is defined by a data grid 140 having a reduced pixel dimension in the X direction.

Similarly, the first set of pixel rows C in the second segment 112 during the lithography process forms a data grid C with a same pixel dimension as the pixel dimension G of the pattern generator 108. The second set of pixel rows D in the second segment 112 during the lithography process forms a data grid D with the same pixel dimension G. However, the data grid D is not only shifted from the data grid C in the X direction but also in the Y direction. A collective exposure dose from both the first set C and the second set D is defined by a data grid having a reduced pixel dimension in the X direction.

The data grid from the second segment 112 is different from the data grid from first segment 110 since there is offset $\Delta y=V*\Delta t$ in the Y direction introduced by the time delay $\Delta t$. Furthermore, a collective exposure dose from both first segment 110 and second segment 112 is defined by a data grid 142 having a reduced pixel dimension in the X direction and a reduced pixel dimension in the Y direction.

By implementing the pattern generator 108 and the method 130, without reducing the pixel size of the pattern generator, the data grid 142 generated thereby has a reduced pixel size as $G*n$ where G is the pixel size of the pattern generator 108. The number of gray levels in each pixel of the data grid 142 is $Ny=2^m-1$. The data volume is increased by a factor $m/n^2$.

Figure 7:
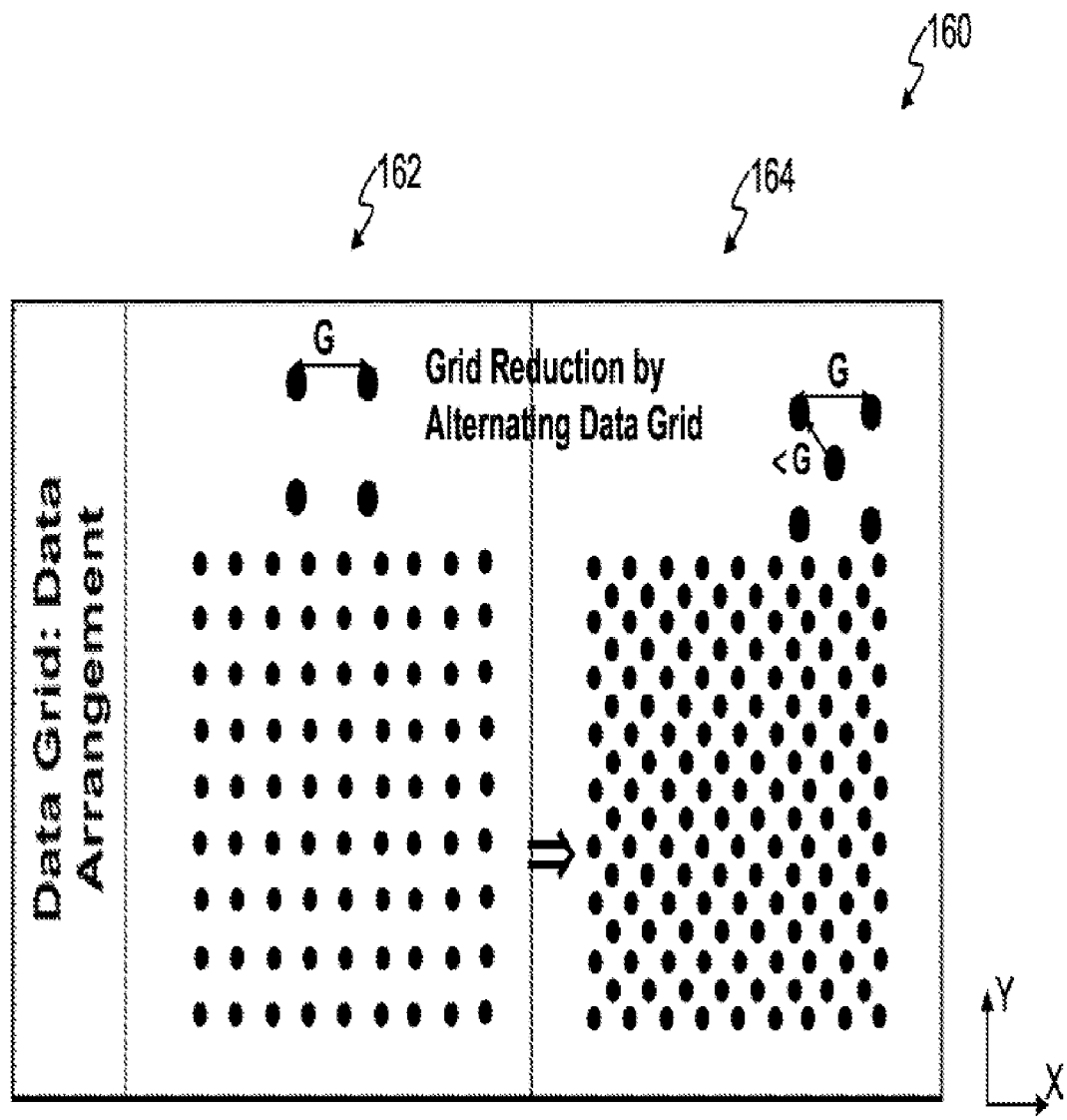
FIG. 7 is a top view of a data grid for a lithography process, according to various aspects of the present disclosure in one embodiment.

FIG. 7 is a schematic view of a method 160 for a lithography process with reduced data grid for small CDs but without reducing the pixel dimensions of the pattern generator. Particularly, the data grid 162 is converted to the alternating data grid 164 with reduced pixel size. For example, the data grid 162 has a pixel dimension G. The data grid 164 by the method 160 has an alternating structure and has a pixel dimension less than G. Thus, the grid reduction is achieved by the disclosed alternating data grid. In the data grid 164, two adjacent pixels with the reduced pixel distance (less than G) span in a direction different from X direction and Y direction as illustrated in FIG. 7. In method 160, the data volume is increased only by a factor $m/n$ or less, much less than the factor $m/n^2$ achieved by the various methods in FIGS. 3, 4, 5 and 6. The method 160 and the corresponding pattern generator are collectively described with reference to FIGS. 8 and 9 according to various embodiments.

Figure 8:
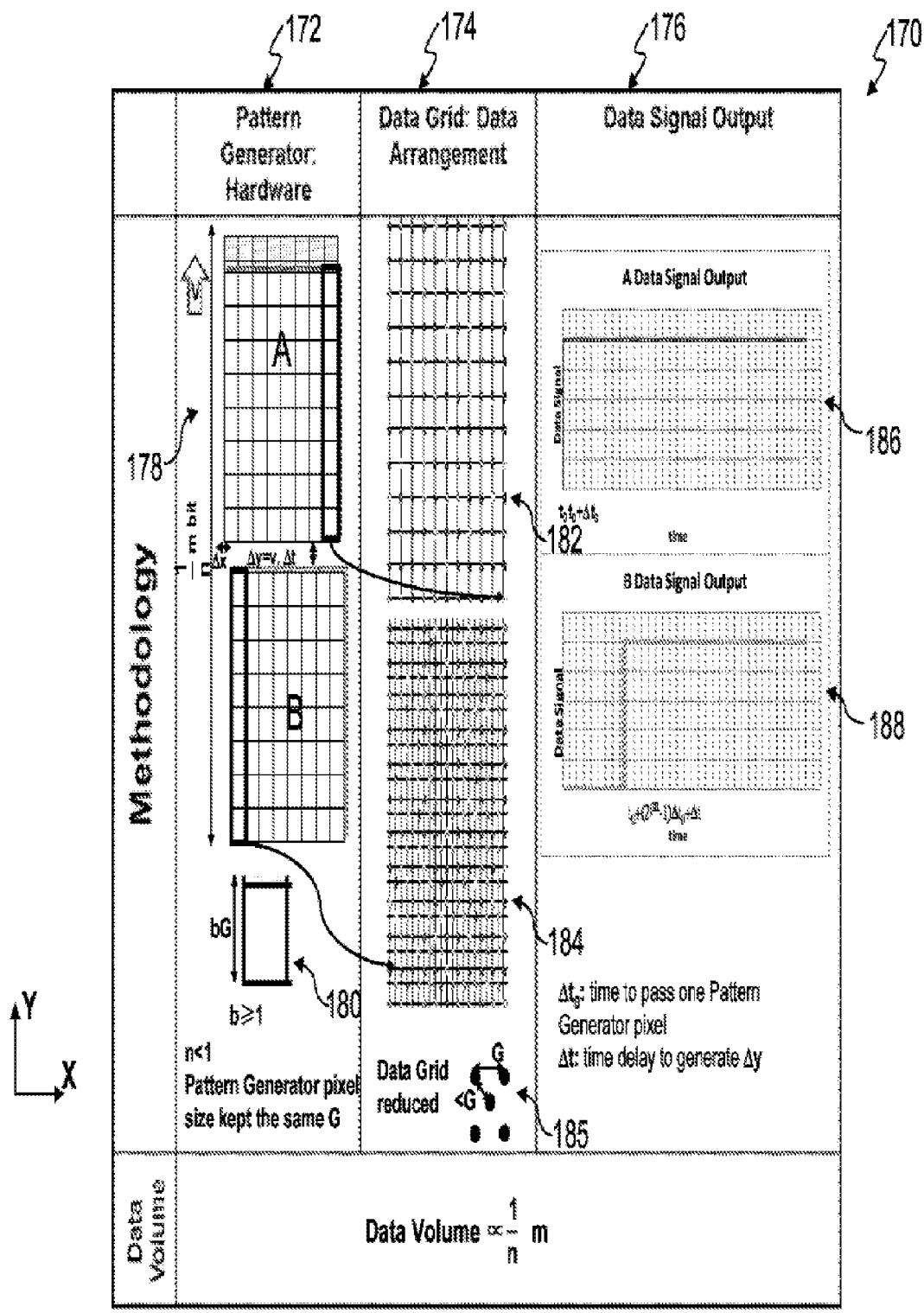

FIG. 8 is a schematic view of a method 170 for a lithography process with reduced data grid for small CDs but without reducing the pixel dimensions of the pattern generator. The method 170 and the corresponding pattern generator are collectively described with reference to FIG. 8 that includes a block 172 for pattern generator, a block 174 for data grid and a block 176 for data signal output. It is still assumed that the CD scales down by a factor n that is less than 1. In one example, the scaling factor n is 0.5.

In the method 170, a pattern generator 178 is used and includes a plurality of segments configured with shift and controlled with time delay. The pattern generator 178 is designed to include a plurality of segments configured along the scan direction that is Y direction. The pixels of the pattern generator 178 still remain the same pixel dimension G. In one example, the pixels have a square geometry and the dimensions of the pixels in both X and Y directions are G. In another embodiment, the pixels have a rectangular geometry 180, and the dimension of the pixels in X direction and the dimension of the pixels in Y direction are different. For example, the dimension of the pixel in X direction is G and the dimension in Y direction is $b*G$ where b is greater than 1. Each segment includes a plurality of pixels in an array, such as an array with multiple rows each spanned in X direction and multiple columns each spanned in Y direction. Furthermore, each row includes Nx pixels and each column includes Ny pixels. To achieve $2^m$ gray levels, the number of pixels in each column is $2^m-1$ or $Ny=2^m-1$. The similar features and actions are not described for simplicity.

Each segment is shifted by a fraction of the pixel dimension along the direction perpendicular to the scan direction and is also controlled to have delayed data signal output. In one example, each segment is shifted by $n*G$ along the direction perpendicular to the scan direction and is also controlled to have delayed data signal output by $n*G/v$ where v is the scan speed.

In the present example for illustration, the pattern generator 178 includes 2 segments labeled as A and B, respectively. In this example, the segment B is shifted from the segment A by $\Delta x$ and is controlled to have a time delay $\Delta t$.

However, the pattern generator 178 is different from other pattern generators presented in FIGS. 3, 4, 5 and 6 as explained below. The reduction to the data grid is achieved but fewer segments are used and therefore less data volume is accomplished. In the pattern generator 48 or 78, four segments or $1/n^2$ segments are included. In either situation, the data volume is increased by the factor $m/n^2$. In the pattern generator 178, two segments or $1/n$ segments are included and each segment remains the same size or the same number of pixels as $Nx*Ny$ wherein $Ny=2^m-1$. Therefore, the data volume is increased only by $m/n$ instead of $m/n^2$.

The segment B is configured to have an offset from the segment A by a distance $\Delta x$ in the X direction and is controlled to have a time delay $\Delta t$ during the lithography process, causing exposure dose shifted in the Y direction by $\Delta y=V*\Delta t$. In one example, each of $\Delta x$ and $\Delta y$ is 0.5G or $n*G$.

The data signal output 186 for the first segment A is indicated in the respective graph. The data signal output 188 for the second segment B is $t_0+(2^m-1)*\Delta t_0+\Delta t$ as indicated in the respective graph.

Accordingly, the first segment A during the lithography process generates an exposure dose defined by a data grid 182 with a same pixel dimensions as the pixel dimensions of the pattern generator 178. The second segment B during the lithography process forms an exposure dose defined by a data grid B with the same pixel dimensions but with a shift $\Delta x$ in X direction and a shift $\Delta y$ in Y direction. A collective exposure dose from both the segment A and the segment B is defined by a data grid 184 having a reduced pixel dimensions as illustrated in 185.

By implementing the pattern generator 178 and the method 170, without reducing the pixel size of the pattern generator, the data grid 182 generated thereby has a reduced pixel dimension $<G$ where G is the pixel dimension of the pattern generator 178. The number of gray levels in each pixel of the data grid 184 is $Ny=2^m-1$. The data volume is increased only by a factor $m/n$.

Figure 9:
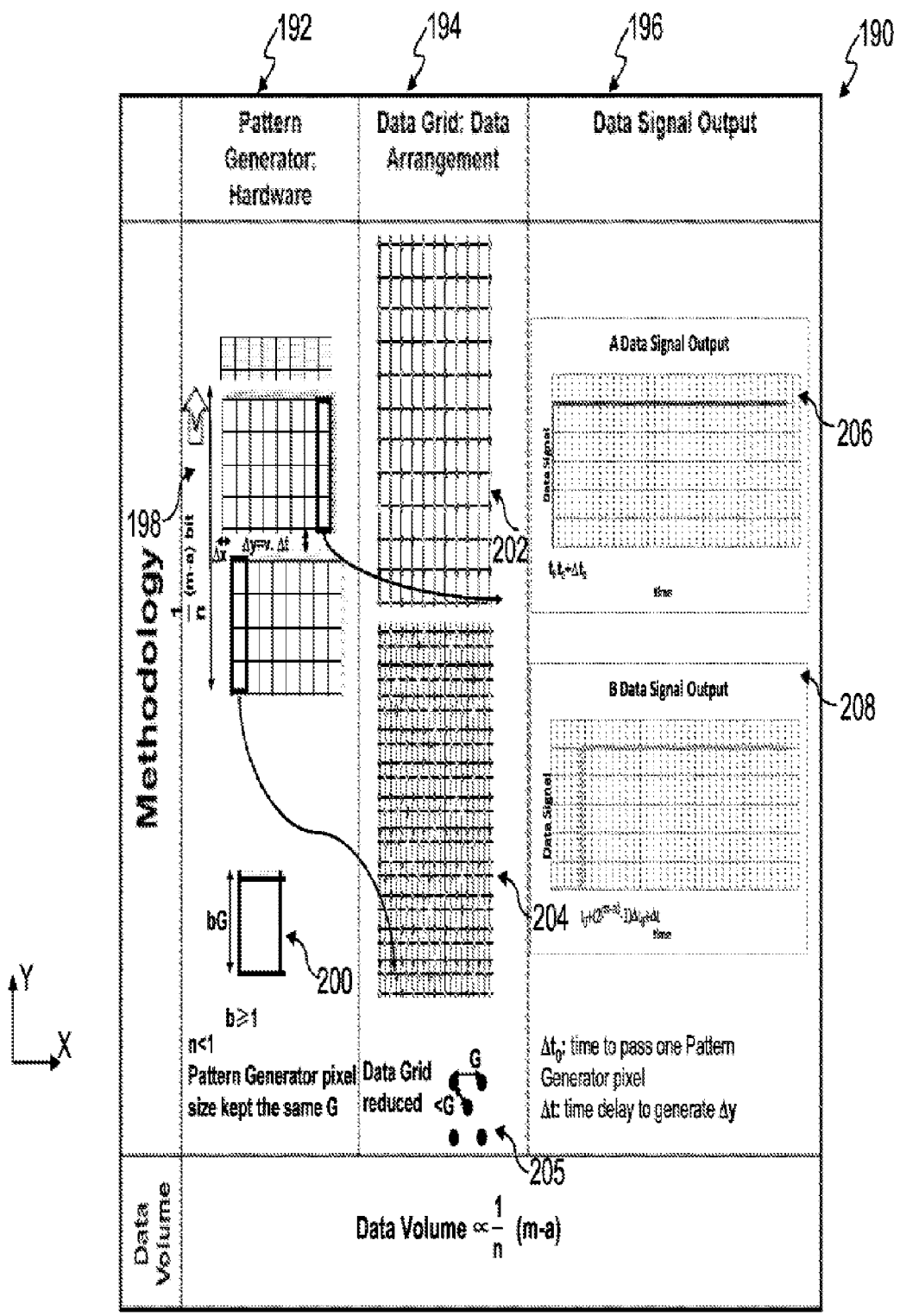

FIG. 9 is a schematic view of a method 190 for a lithography process with reduced data grid for small CDs but without reducing the pixel dimensions of the pattern generator. The method 190 and the corresponding pattern generator are collectively described with reference to FIG. 9 that includes a block 192 for pattern generator, a block 194 for data grid and a block 196 for data signal output. It is still assumed that the CD scales down by a factor n that is less than 1. In one example, the scaling factor n is 0.5.

In the method 190, a pattern generator 198 is used and includes a plurality of segments configured with shift and controlled with time delay. The pattern generator 198 is designed to include a plurality of segments configured along the scan direction that is Y direction. The pixels of the pattern generator 198 still remain the same pixel dimension G. In one example, the pixels have a square geometry and the dimensions of the pixels in both X and Y directions are G. In another embodiment, the pixels have a rectangular geometry 200, and the dimension of the pixels in X direction and the dimension of the pixels in Y direction are different. For example, the dimension of the pixel in X direction is G and the dimension in Y direction is $b*G$ where b is greater than 1. Each segment includes a plurality of pixels in an array, such as an array with multiple rows each spanned in X direction and multiple columns each spanned in Y direction. Furthermore, each row includes Nx pixels and each column includes Ny pixels. However, the gray levels is reduced from $2^m$ to $2^{(m-a)}$, and the number of pixels in each column is $2^{m-a}-1$ or Ny=$2^{m-a}-1$. The parameter "a" is greater or equals to 0.

Each segment is shifted by a fraction of the pixel dimension along the direction perpendicular to the scan direction and is also controlled to have delayed data signal output.

In the present example for illustration, the pattern generator 198 includes 2 segments labeled as A and B, respectively. In this example, the segment B is shifted from the segment A by Δx and is controlled to have a time delay Δt. The pattern generator 198 is similar to the pattern generator 178 but the number of the pixels in each column is reduced. Accordingly, the number of the gray levels is reduced and the data volume is reduced.

The segment B is configured to have an offset from the segment A by a distance Δx in the X direction and is controlled to have a time delay Δt during the lithography process, causing exposure dose shifted in the Y direction by Δy=V*Δt.

The data signal output 206 for the first segment A is indicated in the respective graph. The data signal output 208 for the second segment B is $t_0+(2^{m-a}-1)*\Delta t_0+\Delta t$ as indicated in the respective graph.

Accordingly, the first segment A during the lithography process generates an exposure dose defined by a data grid 202 with a same pixel dimensions as the pixel dimensions of the pattern generator 198. The second segment B during the lithography process forms an exposure dose defined by a data grid B with a same pixel dimensions but with a shift Δx in X direction and a shift Δy in Y direction. A collective exposure dose from both the segment A and the segment B is defined by a data grid 204 having a reduced pixel dimensions as illustrated in 205.

By implementing the pattern generator 198 and the method 190, without reducing the pixel size of the pattern generator, the data grid 204 generated thereby has a reduced pixel size. The number of gray levels is Ny=$2^{m-a}-1$. The data volume is increased only by a factor (m−a)/n.

Figure 10:
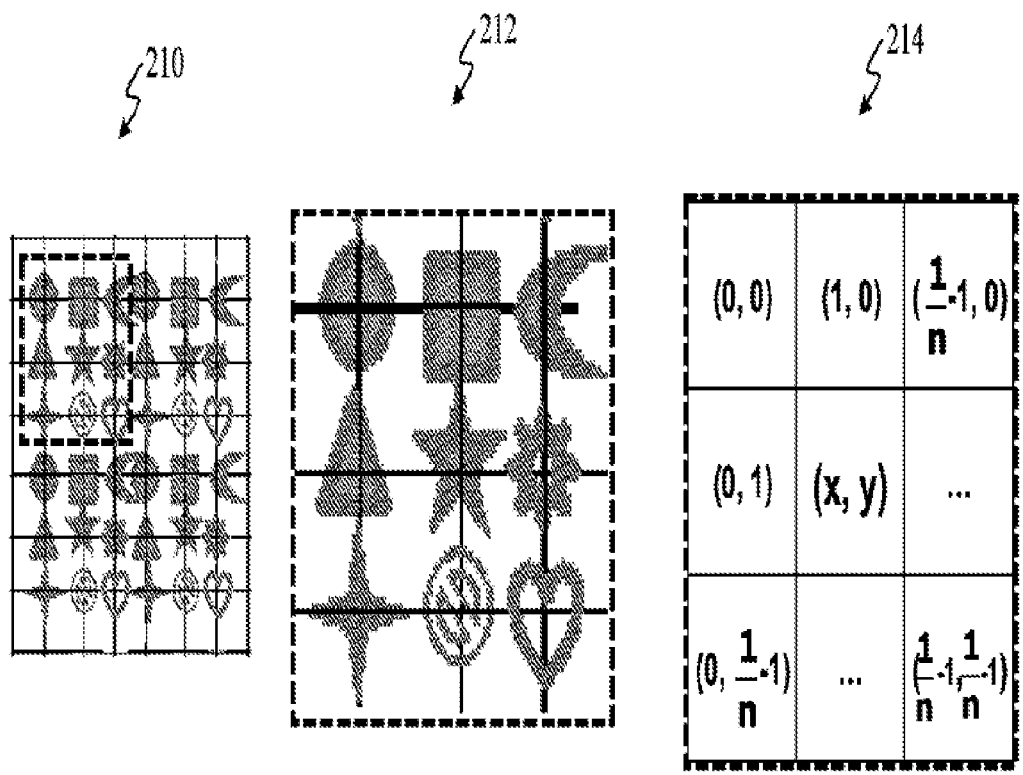
FIGS. 10-12 illustrate data grids in top views and formulae for data signal output, according to various aspects of the present disclosure in various embodiments.

FIG. 10 is a schematic view of a data grid and the respective data signal output. The data grid 210 is, in portion, the data grid 56 of FIG. 3, the data grid 86 of FIG. 4, the data grid 184 of FIG. 8, or the data grid 204 of FIG. 9, constructed according to one embodiment. The data grid 212 is portion of the data grid 210 zoomed in. The corresponding coordinates for the pixels in the data grid 212 are illustrated in 214, for an example where 1/n=3.

The data signal output is determined by the formula $$t = t_0 + (l-1)(2^{(m-a)} - 1)\Delta t_0 + y\Delta t$$

$$l \in 1 \sim \frac{1}{n^2}, a \geq 0$$

where y is the coordinate of the respective pixel in the data grid. The formula can be used to determine the data signal output in various methods 40, 70, 170 and 190, corresponding to the data grids 56, 86, 184 and 204, respectively.

Furthermore, the data grid 212 has the size corresponds to one pixel of the respective pattern generator. The pixel dimension of the data grid 212 is reduced from the respective pixel dimension of the pattern generator. The pixel area $S_2$ of the data grid 212 is reduced from the respective pixel area $S_1$ of the pattern generator. In one embodiment related to the data grid 56 of FIG. 3 and the data grid 86 of FIG. 4, the pixel area $S_2$ of the data grid 212 is reduced from the respective pixel area $S_1$ of the pattern generator by a factor $n^2$ as $S_2=n^2*S_1$. In another embodiment related to the data grid 184 of FIG. 8, or the data grid 204 of FIG. 9, the pixel area $S_2$ of the data grid 212 is reduced from the respective pixel area $S_1$ of the pattern generator such as $S_2<S_1$. The pattern generator is segmented into a plurality of grid segments (or segments). The segments of the pattern generator are configured to have a shift in a direction (X direction) perpendicular to the scan direction and/or are controlled to have time delay to introduce a shift on the scan direction (Y direction) during the lithography process.

In one embodiment, the pattern generator is segmented to $1/n^2$ segments, such as those illustrated in FIGS. 3 and 4. Segments may have a shift in the X direction or a time delay. Each segment have a number of pixels Nx*Ny where Ny=$2^{m-a}-1$. The data volume is increased by a factor $(m-a)/n^2$. The gray levels are reduced from $2^m$ to $2^{m-a}$. In one example, the parameter a=0. In another example, the parameter "a" is an integer greater than 0 but less than m. In the example illustrated in FIG. 10, n=⅓. In other examples illustrated in FIGS. 3 and 4, n=½ (or 0.5).

In another embodiment, the pattern generator is segmented to n segments, such as those illustrated in FIGS. 8 and 9. Each segment has a shift in the X direction and a time delay. The data volume is increased by a factor (m−a)/n. the gray levels are reduced from $2^m$ to $2^{m-a}$.

Figure 11:
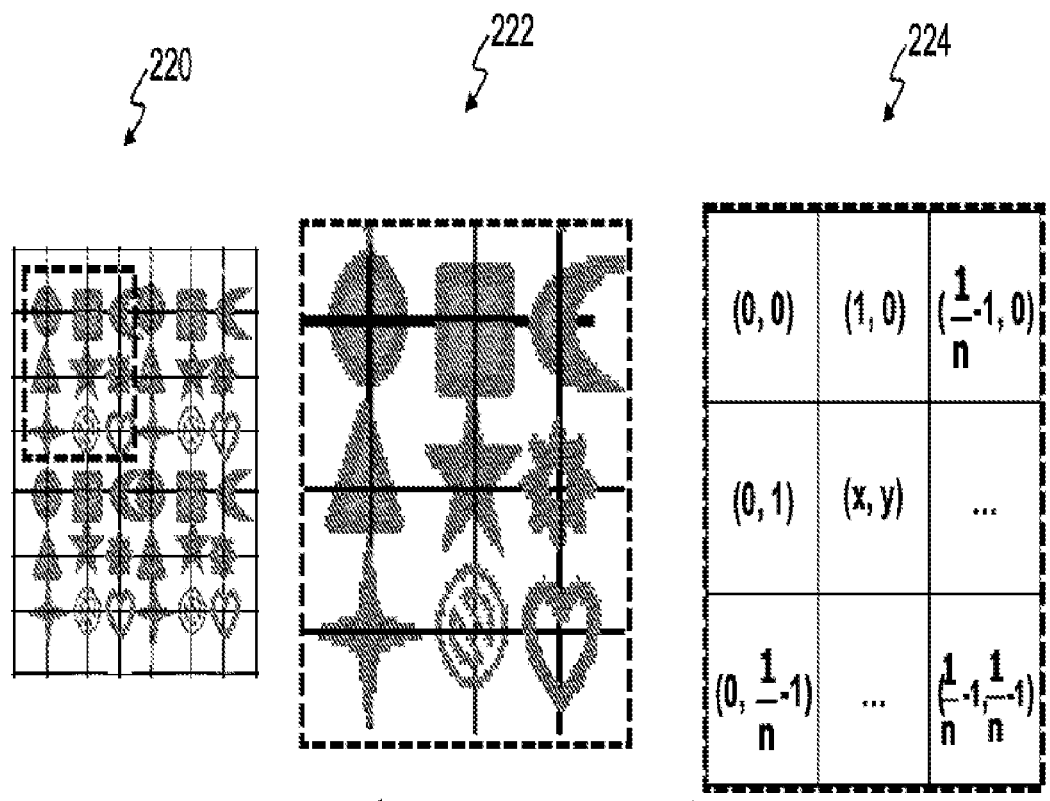

FIG. 11 is a schematic view of a data grid and the respective data signal output. The data grid 220 is, in portion, the data grid 116 of FIG. 5, constructed according to one embodiment. The data grid 222 is portion of the data grid 220 zoomed in. The corresponding coordinates for the pixels in the data grid 222 are illustrated in 224, for a particular example where 1/n=3.

The data signal output is determined by the formula $$t = t_0 + \left(\frac{y}{n}(2^{(m-a)} - 1) + x\right)\Delta t_0 + y\Delta t$$

$$a \geq 0$$

where x and y are the coordinates of the respective pixel in the data grid. The formula can be used to determine the data signal output in the method 100, corresponding to the data grid 116.

Furthermore, the data grid 222 has the size corresponds to one pixel of the respective pattern generator. The pixel dimension of the data grid 222 is reduced from the respective pixel dimension of the pattern generator by a factor n. The pixel area of the data grid 222 is reduced from the respective pixel area of the pattern generator by a factor $n^2$. The pattern generator is segmented into a plurality of grid segments (or segments). The segments of the pattern generator are controlled to have time delay to introduce a shift on the scan direction (Y direction) during the lithography process. Each segment has an alternating structure and has a number of pixels increased by a factor 1/n. Each segment has the number of pixels Nx*Ny where Ny=n*$(2^{m-a}-1)$. Pixel rows in each segment are grouped into $2^{m-a}-1$ groups. Each group includes n pixel rows. The pixel rows in each group are configured adjacent with each other and each row has a shift relative to its adjacent row in the X direction perpendicular to the scan direction. The data volume is increased by a factor $(m-a)/n^2$ or $m/n^2$ if a=0. The gray levels are reduced from $2^m$ to $2^{m-a}$.

Figure 12:
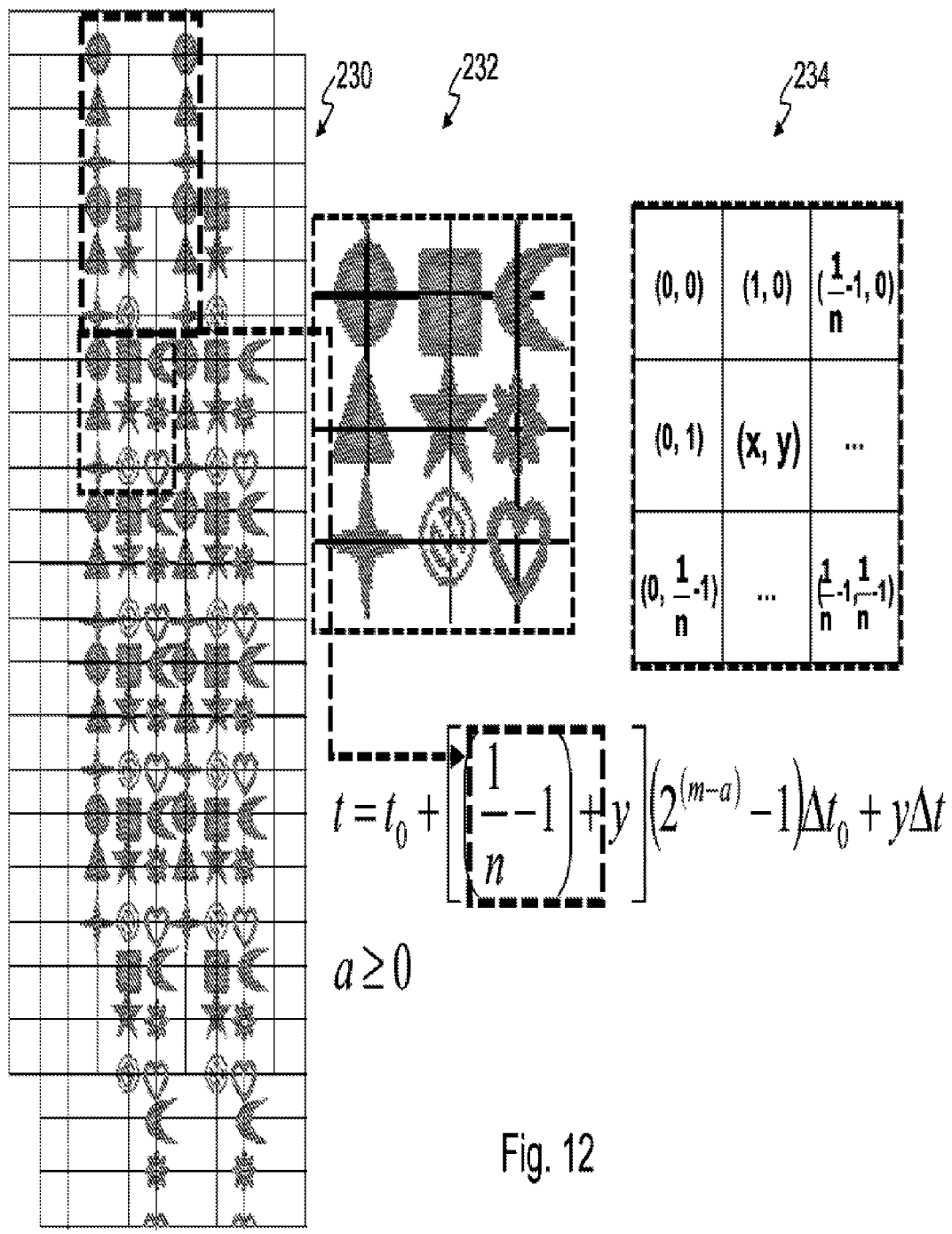

FIG. 12 is a schematic view of a data grid and the respective data signal output. The data grid 230 is, in portion, the data grid 142 of FIG. 6, constructed according to one embodiment. The data grid 232 is portion of the data grid 230 zoomed in. The corresponding coordinates for the pixels in the data grid 232 are illustrated in 234, for a particular example where 1/n=3.

The data signal output is determined by the formula $$t = t_0 + \left[\left(\frac{1}{n} - 1\right) + y\right](2^{(m-a)} - 1)\Delta t_0 + y\Delta t$$
$$a \geq 0$$

The formula can be used to determine the data signal output in the method 130, corresponding to the data grid 146.

Furthermore, the data grid 232 has the size corresponds to one pixel of the respective pattern generator. The pixel dimension of the data grid 232 is reduced from the respective pixel dimension of the pattern generator by a factor n. The pixel area of the data grid 232 is reduced from the respective pixel area of the pattern generator by a factor $n^2$. The pattern generator is segmented into a plurality of grid segments (or segments). The segments of the pattern generator are controlled to have time delay to introduce a shift on the scan direction (Y direction) during the lithography process. Each segment has an alternating structure and has a number of pixels increased by a factor 1/n. Each segment has the number of pixels Nx*Ny where Ny=n*($2^{m-a}$-1). Pixel rows in each segment are grouped into $2^{m-a}$-1 groups. Each group includes n pixel rows. The pixel rows in each group are configured adjacent with each other and each row has a shift relative to its adjacent row in the X direction perpendicular to the scan direction. The data volume is increased by a factor (m-a)/$n^2$ or m/$n^2$ if a=0. The gray levels are reduced from $2^m$ to $2^{m-a}$.

The present disclosure provides one embodiment of a method for a lithography process for reducing a critical dimension (CD) by a factor n wherein n<1. The method includes providing a pattern generator having a first pixel size S1 to generate an alternating data grid having a second pixel size S2 that is <S1, wherein the pattern generator includes multiple grid segments configured to offset from each other in a first direction; and scanning the pattern generator in a second direction perpendicular to the first direction during the lithography process such that each subsequent segment of the grid segments is controlled to have a time delay relative to a preceding segment of the grid segments.

In one embodiment of the method, the pattern generator includes a number of pixels increased by a factor n and a data volume to the pattern generator, the data volume being proportional to 1/n.

In another embodiment, the pattern generator is designed to generate $2^m$ gray levels, and a data volume to the pattern generator is proportional to m/n.

In yet another embodiment, the pattern generator is designed to have a reduced gray levels from $2^m$ to $2^{m-a}$, parameter "a" being greater than 0 and a data volume to the pattern generator is proportional to (m-a)/n.

In yet another embodiment, a number of the grid segments in the pattern generator equals to 1/n. In one embodiment, each of the grid segments includes a grid array with ($2^m$-1) pixels in each column spanned in the second direction and the alternating data grid has $2^m$ gray levels. In another embodiment, each of the grid segments includes a grid array with ($2^{m-a}$-1) pixels in each column spanned in the second direction and the alternating data grid has $2^{m-a}$ gray levels, parameter a being greater than 0.

The present disclosure also provide one embodiment of a pattern generator for a lithography process to form an exposure dose defined in a alternating data grid for reducing a critical dimension (CD) by a factor n wherein n<1. The pattern generator includes a plurality of grid segments configured to offset from each other in a first direction and is controllable to have a time delay during the lithography process; and a plurality of pixels arranged in the grid segments, wherein a number of the pixels is increased by a factor 1/n.

In one embodiment, the pattern generator is designed to generate $2^m$ gray levels, and a data volume to the pattern generator is proportional to m/n.

In another embodiment, the pattern generator is designed to have a reduced gray levels from $2^m$ to $2^{m-a}$, parameter "a" being greater than 0 and a data volume to the pattern generator is proportional to (m-a)/n.

In yet another embodiment, the plurality of pixels in the grid segments each include a shape of square or rectangle.

In yet another embodiment, a number of the grid segments in the pattern generator equals to 1/n. In one embodiment, each of the grid segments includes a grid array with ($2^{m-a}$-1) pixels in each column spanned in the second direction and the alternating data grid has $2^{m-a}$ gray levels, parameter a being equal to or greater than 0.

The present disclosure also provides another embodiment of a method for a lithography process to form an exposure dose defined in an alternating data grid having a first pixel dimension using a pattern generator having a second pixel dimension greater than the first pixel dimension by a scaling factor 1/n where the scaling factor is less than 1. The method includes receiving the pattern generator having multiple grid segments configured to offset from each other in a first direction; and performing an exposure process to a substrate and thereby form a circuit pattern on the substrate. The performing of the exposure process includes scanning the pattern generator in a second direction perpendicular to the first direction; and controlling the grid segments such that each of the grid segments has a time delay during the scanning of the pattern generator.

In one embodiment of the method, the pattern generator has a number of pixels increased by a factor 1/n and a data volume to the pattern generator, the data volume being proportional to 1/n.

In another embodiment, the pattern generator is designed to generate $2^m$ gray levels, and a data volume to the pattern generator is proportional to m/n.

In yet another embodiment, the pattern generator is designed to have a reduced gray levels from $2^m$ to $2^{m-a}$, parameter "a" being greater than 0; and a data volume to the pattern generator is proportional to (m-a)/n.

In yet another embodiment, a number of the grid segments in the pattern generator equals to 1/n. In one embodiment, each of the grid segments includes a grid array with ($2^m$-1) pixels in each column spanned in the second direction and the alternating data grid has $2^m$ gray levels. In another embodiment, each of the grid segments includes a grid array with ($2^{m-a}$-1) pixels in each column spanned in the second direction and the alternating data grid has $2^{m-a}$ gray levels, parameter a being greater than 0.

In yet another embodiment, the performing an exposure process to a substrate includes applying an e-beam to the pattern generator.

In yet another embodiment, the controlling the grid segments such that each of the grid segments has a time delay during the scanning of the pattern generator includes applying to the pattern generator by a data signal output defined in a formula as $$t = t_0 + (l-1)(2^{(m-a)} - 1)\Delta t_0 + y\Delta t$$

$$l \in 1 \sim \frac{1}{n^2}, a \geq 0$$

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithographic method comprising:
   determining an exposure pattern to be transferred to a photoresist film by a pattern generator,
   determining, from the exposure pattern, pixel values for a set of pixels of the pattern generator, wherein the set of pixels are arranged in a plurality of pixel rows extending in a first direction perpendicular to a scan direction of the pattern generator, each row of the plurality of rows is offset from an adjacent row by an amount less than a pixel in the first direction, and the determined pixel values define a total exposure dose that satisfies an exposure dose specified by the pattern.

2. The method of claim 1 further comprising exposing the photoresist film based on the determined pixel values using the pattern generator.

3. The method of claim 1, wherein each row of the plurality of rows is configured to produce a first exposure region on the photoresist film that overlaps with a second exposure region on the photoresist film produced by the adjacent row.

4. The method of claim 3, wherein the first exposure region is configured to overlap an entire height of the second exposure region as measured along the scan direction.

5. The method of claim 1, wherein each pixel of the set of pixels is configured to produce a first exposure region on the photoresist film that overlaps with a second exposure region produced by another pixel of the set of pixels in a row adjacent to the pixel.

6. The method of claim 5, wherein the first exposure region is configured to overlap by an amount less than an entire width of the second exposure region as measured along the first direction.

7. The method of claim 1, wherein the set of pixels is further arranged in a plurality of segments, wherein each segment includes a set of contiguous pixel rows, and wherein each segment is configured to produce a first exposure region on the photoresist film that overlaps with a second exposure region on the photoresist film produced by another segment of the plurality of segments.

8. The method of claim 7, wherein the first exposure region is configured to be offset from the second exposure region by an amount less than an entire pixel height as measured along the scan direction.

9. The method of claim 7, wherein the total exposure dose accounts for a contribution from each of the plurality of segments.

10. A method comprising:
    receiving a pattern to be transferred to a workpiece by a pattern generator, wherein the pattern generator includes a plurality of pixels for exposing the workpiece, the plurality of pixels are arranged in a plurality of rows and a plurality of segments, each of the plurality of segments includes a set of contiguous rows of the plurality of rows, and each row of the plurality of rows is offset from an adjacent row by less than a pixel width,
    determining a pixel state for each of the plurality of pixels based on the pattern such that an exposure dose produced on the workpiece by the plurality of pixels satisfies the pattern.

11. The method of claim 10, wherein each row of the plurality of rows is configured to produce a first exposure region on the workpiece that overlaps with a second exposure region on the workpiece produced by the adjacent row.

12. The method of claim 11, wherein the first exposure region is configured to overlap an entire height of the second exposure region.

13. The method of claim 10, wherein each pixel of the plurality of pixels is configured to produce a first exposure region on the workpiece that overlaps with a second exposure region produced by another pixel of the plurality of pixels in a row adjacent to the pixel.

14. The method of claim 13, wherein the first exposure region is configured to overlap the second exposure region by an amount less than the pixel width.

15. The method of claim 10, wherein each segment of the plurality of segments is configured produce a first exposure region that overlaps and is offset from a second exposure region produced by another segment of the plurality of segments.

16. A method comprising
    receiving a circuit pattern to be formed on a substrate by a pattern generator,
    determining pixel values for a first row of pixels of the pattern generator and a second row of pixels of the pattern generator, wherein the first row of pixels and the second row of pixels are disposed adjacently on the pattern generator, the first row of pixels is offset from the second row of pixels by an amount less than a pixel width, and the pixel values are configured to project the circuit pattern on the substrate such that a collective exposure dose that includes a dose from the first row of pixels and a dose from the second row of pixels satisfies an exposure dose specified by the circuit pattern,
    exposing the substrate by applying the pixel values to the first row of pixels; and
    exposing the substrate by applying the pixel values to the second row of pixels.

17. The method of claim 16, wherein a first exposure area produced by the first row of pixels overlaps a second exposure area produced by the second row of pixels.

18. The method of claim 17, wherein the first exposure area is offset from the second exposure area by less than the pixel width.

19. The method of claim 16, wherein the offset between the first row of pixels and the second row of pixels is configured to control a critical dimension of the circuit pattern.

20. The method of claim 16,
    wherein the pattern generator includes a first segment and a second segment,
    wherein the first segment includes the first row of pixels and the second row of pixels, and
    wherein an exposure area produced by the first segment is configured to overlap an exposure area produced by the second segment and be offset therefrom by an amount less than a pixel height.

* * * * *